(12) United States Patent
Purakh et al.

(10) Patent No.: US 10,529,738 B2
(45) Date of Patent: Jan. 7, 2020

(54) INTEGRATED CIRCUITS WITH SELECTIVELY STRAINED DEVICE REGIONS AND METHODS FOR FABRICATING SAME

(71) Applicant: Globalfoundries Singapore Pte. Ltd., Singapore (SG)

(72) Inventors: Raj Verma Purakh, Singapore (SG); Shaoqiang Zhang, Singapore (SG); Rui Tze Toh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 170 days.

(21) Appl. No.: 15/140,863

(22) Filed: Apr. 28, 2016

(65) Prior Publication Data

US 2017/0317103 A1 Nov. 2, 2017

(51) Int. Cl.
*H01L 29/66* (2006.01)
*H01L 29/778* (2006.01)
(Continued)

(52) U.S. Cl.
CPC .... *H01L 27/1203* (2013.01); *H01L 21/02238* (2013.01); *H01L 21/02532* (2013.01);
(Continued)

(58) Field of Classification Search
CPC ........... H01L 27/1203; H01L 21/02236; H01L 21/02532; H01L 21/02636; H01L 21/3081; H01L 21/3086; H01L 21/76283; H01L 21/84; H01L 29/161; H01L 29/66431; H01L 29/66477; H01L 29/778; H01L 29/7842; H01L 27/1214; H01L 27/1229; H01L 27/1233; H01L 27/1251; H01L 27/76283; H01L 21/02; H01L 21/02238; H01L 21/31053; H01L 21/31111; H01L 21/31144; H01L 29/1054; H01L 29/66651; H01L 29/7849; H01L 21/32105
(Continued)

(56) References Cited

U.S. PATENT DOCUMENTS 6,111,267 A * 8/2000 Fischer ............. H01L 21/82380
257/19
6,190,999 B1 * 2/2001 Hung ................ H01L 21/76224
257/E21.546

(Continued)

OTHER PUBLICATIONS

Mishra et al., AlGaN/GaN HEMTs—An Overview of Device Operation and Applications, Proceedings fo the IEEE, Jun. 2002, pp. 1022-1031, vol. 90, No. 6.

*Primary Examiner* — Sophia T Nguyen
(74) *Attorney, Agent, or Firm* — Thompson Hine LLP

(57) ABSTRACT

Integrated circuits and methods for fabricating integrated circuits are provided. An exemplary method for fabricating an integrated circuit includes providing a substrate including a semiconductor layer over an insulator layer. The method includes selectively replacing portions of the semiconductor layer with insulator material to define an isolated semiconductor layer region. Further, the method includes selectively forming a relaxed layer on the isolated semiconductor layer region. Also, the method includes selectively forming a strained layer on the relaxed layer. The method forms a device over the strained layer.

9 Claims, 3 Drawing Sheets

(51) Int. Cl.
*H01L 29/10* (2006.01)
*H01L 29/78* (2006.01)
*H01L 27/12* (2006.01)
*H01L 21/762* (2006.01)
*H01L 21/02* (2006.01)
*H01L 21/84* (2006.01)
*H01L 21/3105* (2006.01)
*H01L 21/32* (2006.01)
*H01L 21/311* (2006.01)
*H01L 21/77* (2017.01)

(52) U.S. Cl.
CPC .. *H01L 21/02653* (2013.01); *H01L 21/31053* (2013.01); *H01L 21/32* (2013.01); *H01L 21/76283* (2013.01); *H01L 21/84* (2013.01); *H01L 27/127* (2013.01); *H01L 27/1222* (2013.01); *H01L 27/1233* (2013.01); *H01L 27/1251* (2013.01); *H01L 27/1262* (2013.01); *H01L 27/1288* (2013.01); *H01L 29/1054* (2013.01); *H01L 29/66431* (2013.01); *H01L 29/66575* (2013.01); *H01L 29/66651* (2013.01); *H01L 29/66659* (2013.01); *H01L 29/778* (2013.01); *H01L 21/02639* (2013.01); *H01L 21/31144* (2013.01); *H01L 29/665* (2013.01); *H01L 29/6656* (2013.01); *H01L 29/7824* (2013.01); *H01L 2021/775* (2013.01)

(58) Field of Classification Search
USPC ........................................................ 257/347
See application file for complete search history.

(56) References Cited

U.S. PATENT DOCUMENTS

| | | | | |
|---|---|---|---|---|
| 6,410,403 B1* | 6/2002 | Wu | H01L 21/31053 | 257/E21.244 |
| 6,429,061 B1* | 8/2002 | Rim | H01L 21/0237 | 257/E21.131 |
| 6,448,114 B1* | 9/2002 | An | H01L 21/84 | 257/E21.703 |
| 6,583,015 B2* | 6/2003 | Fitzgerald | H01L 21/02381 | 257/E21.129 |
| 6,607,948 B1* | 8/2003 | Sugiyama | H01L 21/02381 | 438/151 |
| 6,646,322 B2* | 11/2003 | Fitzgerald | H01L 21/02381 | 257/531 |
| 6,703,271 B2* | 3/2004 | Yeo | H01L 21/28114 | 438/221 |
| 6,713,779 B2* | 3/2004 | Tezuka | H01L 21/84 | 257/19 |
| 6,765,227 B1* | 7/2004 | Yu | H01L 21/76256 | 257/19 |
| 6,849,883 B2* | 2/2005 | Okihara | H01L 21/82341 | 257/190 |
| 6,940,089 B2* | 9/2005 | Cheng | H01L 21/30608 | 257/19 |
| 7,138,310 B2* | 11/2006 | Currie | H01L 21/82380 | 438/199 |
| 7,138,649 B2* | 11/2006 | Currie | H01L 21/82341 | 257/19 |
| 7,141,459 B2* | 11/2006 | Yang | H01L 21/7624 | 438/154 |
| 7,256,142 B2* | 8/2007 | Fitzgerald | H01L 21/02381 | 257/E21.129 |
| 7,368,338 B2* | 5/2008 | Yamazaki | H01L 27/105 | 257/E21.179 |
| 7,384,829 B2* | 6/2008 | Cheng | H01L 21/82341 | 257/E21.618 |
| 7,449,379 B2* | 11/2008 | Ochimizu | H01L 21/76281 | 257/E21.633 |
| 7,462,549 B2* | 12/2008 | Xiang | H01L 21/76283 | 257/E21.411 |
| 7,482,252 B1* | 1/2009 | Wu | H01L 21/02488 | 438/479 |
| 7,547,605 B2* | 6/2009 | Huang | H01L 21/82380 | 257/E21.633 |
| 7,838,392 B2* | 11/2010 | Langdo | H01L 21/28518 | 257/E21.567 |
| 7,888,201 B2* | 2/2011 | Yeo | H01L 21/84 | 257/E21.661 |
| 8,053,304 B2* | 11/2011 | Ko | H01L 21/82380 | 257/E21.461 |
| 8,377,773 B1* | 2/2013 | Scheiper | H01L 21/82380 | 257/E21.409 |
| 8,822,282 B2 | 9/2014 | Fitzgerald | | |
| 9,214,561 B2* | 12/2015 | Abou-Khalil | H01L 29/78654 | |
| 10,008,501 B2* | 6/2018 | Hsiao | H01L 29/1054 | |
| 10,062,712 B1* | 8/2018 | Moen | H01L 27/1203 | |
| 2001/0003364 A1* | 6/2001 | Sugawara | H01L 21/82389 | 257/192 |
| 2002/0038898 A1* | 4/2002 | Sugiyama | H01L 21/84 | 257/378 |
| 2002/0100942 A1* | 8/2002 | Fitzgerald | H01L 21/82380 | 257/369 |
| 2002/0123167 A1* | 9/2002 | Fitzgerald | H01L 21/02381 | 438/47 |
| 2002/0125497 A1* | 9/2002 | Fitzgerald | H01L 21/02381 | 257/191 |
| 2002/0168864 A1* | 11/2002 | Cheng | H01L 21/30608 | 438/725 |
| 2003/0003679 A1* | 1/2003 | Doyle | H01L 21/76254 | 438/406 |
| 2003/0013323 A1* | 1/2003 | Hammond | H01L 21/82380 | 438/770 |
| 2003/0057416 A1* | 3/2003 | Currie | H01L 29/105 | 257/19 |
| 2003/0057439 A1* | 3/2003 | Fitzgerald | H01L 21/82380 | 257/192 |
| 2003/0203600 A1* | 10/2003 | Chu | H01L 21/02381 | 438/479 |
| 2003/0218189 A1* | 11/2003 | Christiansen | H01L 21/02378 | 257/200 |
| 2004/0079993 A1* | 4/2004 | Ning | H01L 21/84 | 257/347 |
| 2004/0180478 A1* | 9/2004 | Yang | H01L 21/7624 | 438/154 |
| 2004/0259295 A1* | 12/2004 | Tomiye | H01L 21/84 | 438/155 |
| 2005/0009263 A1* | 1/2005 | Yeo | H01L 21/28114 | 438/221 |
| 2005/0095807 A1* | 5/2005 | Xiang | C12N 5/0623 | 438/424 |
| 2005/0239256 A1* | 10/2005 | Li | H01L 21/2652 | 438/289 |
| 2005/0285097 A1* | 12/2005 | Shang | H01L 21/82380 | 257/19 |
| 2006/0022270 A1* | 2/2006 | Boyd | H01L 21/76283 | 257/351 |
| 2006/0113605 A1* | 6/2006 | Currie | H01L 21/82380 | 257/368 |
| 2007/0040235 A1* | 2/2007 | Chan | H01L 21/76229 | 257/510 |
| 2007/0145481 A1* | 6/2007 | Tilke | H01L 21/76251 | 257/347 |
| 2007/0181977 A1* | 8/2007 | Lochtefeld | H01L 21/82380 | 257/618 |
| 2008/0017952 A1* | 1/2008 | Cody | H01L 21/02381 | 257/613 |
| 2008/0099794 A1* | 5/2008 | Beyer | H01L 21/82380 | 257/255 |
| 2008/0116487 A1* | 5/2008 | Lee | H01L 21/2683 | 257/194 |
| 2009/0236663 A1* | 9/2009 | Teo | H01L 21/82380 | 257/347 |
| 2010/0055867 A1* | 3/2010 | Hoentschel | H01L 21/7624 | 438/424 |

(56) References Cited

U.S. PATENT DOCUMENTS

| | | | |
|---|---|---|---|
| 2011/0169049 A1* | 7/2011 | Loo | H01L 21/2254 257/190 |
| 2012/0231606 A1* | 9/2012 | Nguyen | H01L 21/76254 438/424 |
| 2013/0105917 A1* | 5/2013 | Kronholz | H01L 29/6659 257/410 |
| 2014/0329378 A1* | 11/2014 | Hung | H01L 21/2807 438/585 |
| 2015/0187934 A1* | 7/2015 | Zhang | H01L 29/7817 257/338 |
| 2017/0040996 A1* | 2/2017 | Zhao | H03K 17/693 |
| 2017/0170208 A1* | 6/2017 | Yuan | H01L 21/02565 |
| 2017/0317103 A1* | 11/2017 | Purakh | H01L 27/1203 |
| 2017/0345724 A1* | 11/2017 | Costaganna | H01L 29/66772 |

* cited by examiner

INTEGRATED CIRCUITS WITH SELECTIVELY STRAINED DEVICE REGIONS AND METHODS FOR FABRICATING SAME

TECHNICAL FIELD

The present disclosure generally relates to integrated circuits and methods for fabricating integrated circuits, and more particularly relates to integrated circuits having selectively strained semiconductor device regions and to methods for fabricating such integrated circuits.

BACKGROUND $R_{on}$ $C_{off}$ is the figure of merit that is used to rate the performance of a radiofrequency (RF) switch transistor device. $R_{on}$ $C_{off}$ is the product of the $R_{on}$ and $C_{off}$ values of the transistor and is used to measure overall switch performance. It is important that both metrics be as low as possible, as both will affect the performance of the switch.

A mechanical switch's "on/off" state is determined by physically changing the switch's position. RF switches use an electrical input at the gate of the RF transistor to turn "on" or "off". A positive voltage turns the switch on and a negative voltage turns it off. In design schematics, the "on" state is represented as a resistor and the "off" state as a capacitor.

When an RF switch is turned on, a low resistance allows more current to travel across the transistor. This metric is called $R_{on}$. $R_{on}$ is inversely proportional to the width of the transistor. The wider the transistor the lower the resistance, which allows more of the current to get through.

A low capacitance will reduce signal loss by reducing capacitive coupling across the transistor when the switch is off. This metric is called $C_{off}$. $C_{off}$ is directly proportional to the width of the transistor. The wider the transistor the higher the capacitance, and the more the signal loss via capacitive coupling across the transistor when the switch is off.

$R_{on}$ $C_{off}$ improvement by scaling channel length has reached a limit where the trade-offs involved in continuous scaling outweigh the benefits. To improve Ron-Coff beyond the channel length scaling limit, a new device architecture is required. For example, MEMS technology is promising for further switch improvement. Previous attempts have been made to improve $R_{on}$ $C_{off}$ by building devices on gallium arsenide (GaAs) substrates or silicon on sapphire (SOS) substrates, which are far more expensive to manufacture as compared to conventional silicon substrates. Furthermore, scaling in such materials is not as common as silicon, where most of the fabrication technologies can be leveraged from CMOS processing. In addition, use of GaAs or SOS substrates typically do not allow for inexpensive integration with CMOS processing flow for forming other devices, such as high density logic devices, high voltage EDMOS or LDMOS devices, such as for power amplifier applications.

Accordingly, it is desirable to provide integrated circuits having improved $R_{on}$ $C_{off}$ performance using conventional silicon substrates. In addition, it is desirable to provide methods for fabricating integrated circuits having improved $R_{on}$ $C_{off}$ performance. Furthermore, other desirable features and characteristics will become apparent from the subsequent detailed description and the appended claims, taken in conjunction with the accompanying drawings and the foregoing technical field and background.

BRIEF SUMMARY

Integrated circuits and methods for fabricating integrated circuits are provided. In accordance with one embodiment, a method for fabricating an integrated circuit includes providing a substrate including a semiconductor layer over an insulator layer. The method includes selectively replacing portions of the semiconductor layer with insulator material to define an isolated semiconductor layer region. Further, the method includes selectively forming a relaxed layer on the isolated semiconductor layer region. Also, the method includes selectively forming a strained layer on the relaxed layer. The method also includes forming a device over the strained layer.

In another embodiment, a method for fabricating an integrated circuit is provided and includes providing a substrate including a semiconductor layer over an insulator layer. The method includes selectively thinning a region of the semiconductor layer to define a thinned region of the semiconductor layer. Also, the method includes selectively forming a relaxed layer on the thinned region of the semiconductor layer. Further, the method includes selectively forming a strained layer on the relaxed layer. The method includes forming a device with a channel in the strained layer.

In accordance with another embodiment, an integrated circuit is provided and includes a substrate with a semiconductor layer overlying an insulator layer. The semiconductor layer has a first thickness. The integrated circuit is provided with a device region including a thinned portion of the semiconductor layer having a thickness less than the first thickness. Also, the integrated circuit includes a relaxed layer on the thinned region of the semiconductor layer, a strained layer on the relaxed layer, and a device with a channel in the strained layer.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

Embodiments of the integrated circuits having selectively strained device regions and methods for fabricating integrated circuits having selectively strained device regions will hereinafter be described in conjunction with the following drawing figures, wherein like numerals denote like elements, and wherein.

DETAILED DESCRIPTION

Figure 1:
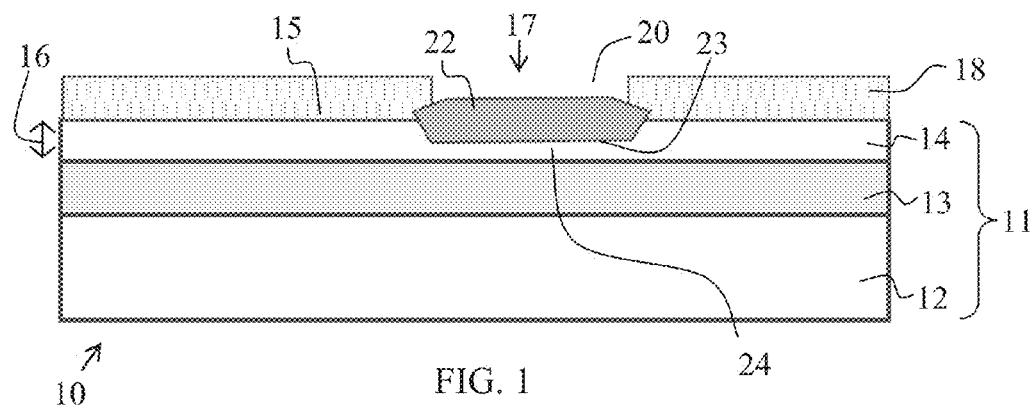
FIGS. 1-9 illustrate, in cross section, a portion of an integrated circuit and a method for fabricating the integrated circuit in accordance with various embodiments herein.

The following detailed description is merely exemplary in nature and is not intended to limit the integrated circuits or the methods for fabricating integrated circuits as claimed herein. Furthermore, there is no intention to be bound by any expressed or implied theory presented in the preceding technical field, background or brief summary, or in the following detailed description.

In accordance with the various embodiments herein, integrated circuits having selectively strained device regions and methods for fabricating integrated circuits having selectively strained device regions are provided. Generally, the following embodiments relate to the formation of an integrated circuit including, but not limited to, a device such as a radiofrequency (RF) switch FET, a high-electron mobility transistor (HEMT), or another transistor device formed over a strained device region. Particular embodiments of an exemplary method include forming an additional CMOS device over a non-strained device region. In such embodiments, both the strained and non-strained devices are formed during conventional CMOS processing.

Unlike prior art attempts to form devices with improved $R_{on} C_{off}$ improvement for devices by building on GaAs or SOS substrates, embodiments described herein allow for the integration of devices having improved $R_{on} C_{off}$ in a partially depleted semiconductor-on-insulator (PDSOI) CMOS flow, which allows a larger integration scale of various functional blocks in a single chip. An exemplary embodiment provides a method to make fully-depleted (FD) switch FET devices on PDSOI, incorporated with SiGe strain to further improve device performance.

Embodiments herein use silicon thinning and straining to create switch FET devices having improved $R_{on} C_{off}$ (compared to conventional SOI switches). Exemplary embodiments of the silicon straining process described herein can achieve $R_{on}$ reduction of from about 1.3 to about 1.8 times as compared to conventional RFSOI switch FET devices. For example, $R_{on}$ may be reduced by from about 1.5 to about 1.7 times as compared to conventional RFSOI switch FET devices. In exemplary embodiments, a silicon thinning process reduces sidewall junction capacitance by about 50% as compared to conventional non-thinned embodiments, leading to a lower $C_{off}$. In exemplary embodiments, the silicon thinning also brings the device into a fully-depleted mode under most switch biasing conditions, leading to a better on-off ratio and subsequently better $R_{on}$ performance.

FIGS. 1-9 illustrate sequentially a method for fabricating an integrated circuit having a selectively strained semiconductor device region in accordance with various embodiments herein. Various steps in the design and composition of integrated circuits are well known and so, in the interest of brevity, many conventional steps will only be mentioned briefly herein or will be omitted entirely without providing the well known process details. Further, it is noted that integrated circuits include a varying number of components and that single components shown in the illustrations may be representative of multiple components in the integrated circuits.

The drawings are semi-diagrammatic and not to scale and, particularly, some of the dimensions are for the clarity of presentation and are shown exaggerated in the drawings. Similarly, although the views in the drawings for ease of description generally show similar orientations, this depiction in the drawings is arbitrary. Generally, the integrated circuit can be operated in any orientation. As used herein, it will be understood that when an element or layer is referred to as being "over" or "under" another element or layer, it may be directly on the other element or layer, or intervening elements or layers may be present. When an element or layer is referred to as being "on" another element or layer, it is directly on and in contact with the other element or layer. Further, spatially relative terms, such as "upper", "over", "lower", "under" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

Turning now to FIG. 1, in an exemplary embodiment, the process of fabricating an integrated circuit 10 includes providing a substrate 11, such as a semiconductor-on insulator (SOI) substrate. The exemplary substrate 11 includes a bulk substrate layer 12, an insulator layer 13, and a semiconductor layer 14. As shown, the insulator layer 13 isolates the semiconductor layer 14 from the substrate layer 12. An exemplary substrate layer 12 is formed from silicon or other suitable semiconductor material. An exemplary insulator layer 13 is formed from silicon oxide, commonly referred to as buried oxide (BOX), or other suitable insulating material. As used herein, an insulator material refers to a material having a resistivity greater than $1.0 \times 103$ Ohm-cm. An exemplary semiconductor layer 14 is silicon, or other suitable semiconductor material.

As shown, the semiconductor layer 14 includes a substantially planar upper surface 15. Further, the semiconductor layer 14 is formed with a thickness 16 (extending from the insulator layer 13 to the upper surface 15) of from about 1000 to about 1700 Angstroms. As shown, the semiconductor layer 14 includes a selected device region 17 for the formation of a strained device, as described below.

In FIG. 1, a hard mask 18 is formed and patterned over the semiconductor layer 14. An exemplary hard mask layer 18 is silicon nitride. In an exemplary embodiment, a chemical vapor deposition (CVD) process is used to form a silicon nitride hard mask layer 18 on the surface 15 of the semiconductor layer 14. The hard mask 18 is selectively patterned and etched to form an opening 20 that exposes the selected device region 17 of the semiconductor layer 14.

A sacrificial layer 22 is formed on the exposed portion of the semiconductor layer 14. An exemplary sacrificial layer 22 is silicon oxide. In an exemplary embodiment, a silicon oxide sacrificial layer 22 is formed by a thermal growth process. For example, a local oxidation of silicon (LOCOS) process may be performed in which oxygen penetrates the surface 15 of the semiconductor layer 14 to form the silicon oxide sacrificial layer 22, such that a horizontal interface 23 between the sacrificial layer 22 and the semiconductor layer 14 is located at a plane lower than the surface 15 of the semiconductor layer 14, i.e., a plane closer to the substrate 12. As a result, the exemplary process thins, or reduces the thickness of, a region 24 of the semiconductor layer 14 underlying the sacrificial layer 22. An exemplary thinned region 24 has a thickness of from about 200 to about 400 Angstroms.

Figure 2:
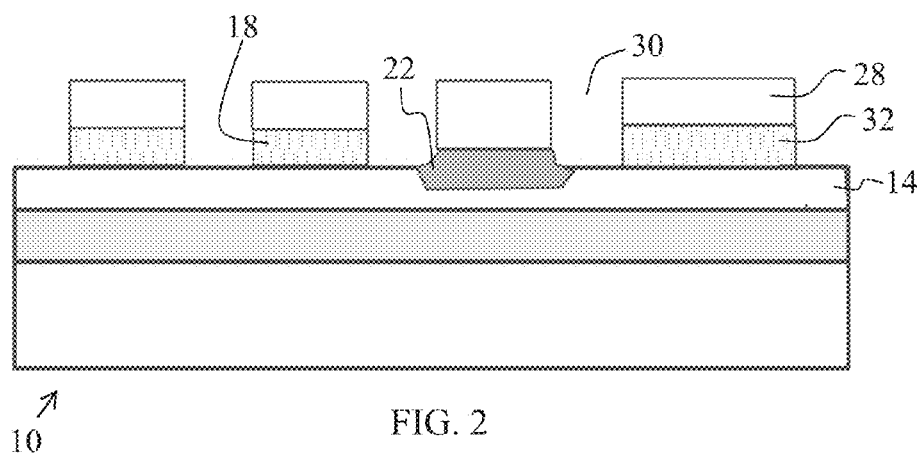

In FIG. 2, a photoresist mask 28 is deposited over the structure of FIG. 1, including on the sacrificial layer 22 and hard mask 18. The photoresist mask 28 is exposed and patterned to include openings 30 that expose underlying portions of the sacrificial layer 22 and hard mask 18 for the later formation of isolation regions. The underlying portions of the hard mask 18 are etched in a process stopping on the sacrificial layer 22 and semiconductor layer 14. As a result, a patterned hard mask 32 is formed.

Figure 3:
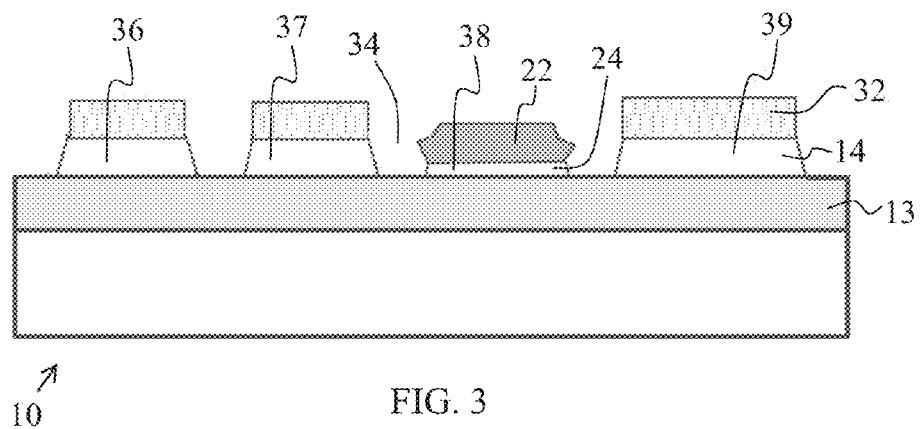

In the embodiment of FIG. 3, the photoresist mask 28 is removed, such as by a resist strip process. Further, the portions of the semiconductor layer 14 not covered by the patterned hard mask 32 or sacrificial layer 22 are etched to form trenches 34. For example, a dry etch, such as a reactive ion etch (ME) process, may be performed to completely etch the exposed portions of the semiconductor layer 14 to expose portions of the insulator layer 13 under the trenches 34. The etch process forms islands 36, 37, 38, and 39 of the semiconductor layer 14 that are completed isolated from one another by the trenches 34.

Figure 4:
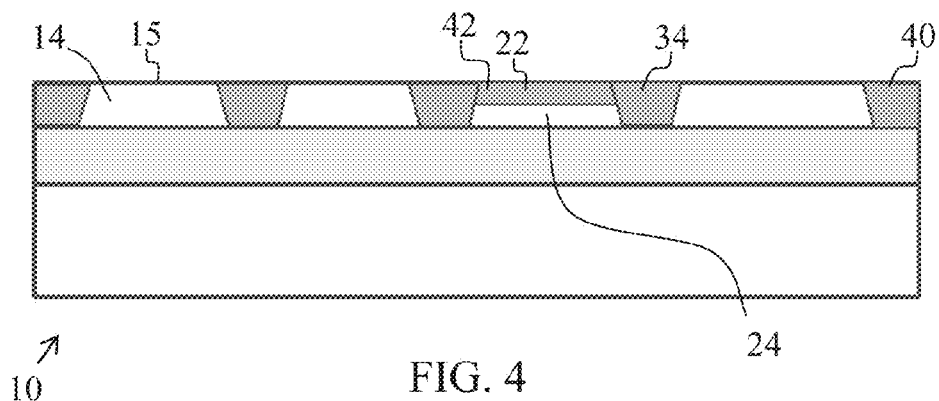

The process continues in FIG. 4 with the deposition of insulating material 40 into the trenches 34. An exemplary isolation material 40 is silicon oxide. In an exemplary embodiment, a HDP process is performed to deposit the silicon oxide insulating material 40. The process forms an overburden portion of the isolation material 40 over the upper surface 15 of the semiconductor layer 14. In embodiments, a planarization process, such as a chemical mechanical planarization process, is performed to remove the overburden portion of the isolation material 40, the patterned hard mask 32, and a portion of the sacrificial layer 22. As shown, a portion 42 of the sacrificial layer 22 lower than the upper surface 15 remains overlying the thinned region 24 of the semiconductor layer 14. A post-planarization strip may be performed to remove portions of the hard mask material 18 that remains over the islands 36, 37, 38, and 39 of the semiconductor layer 14. For example, for a silicon nitride hard mask, a nitride strip may be performed with $H_3PO_4$.

Figure 5:
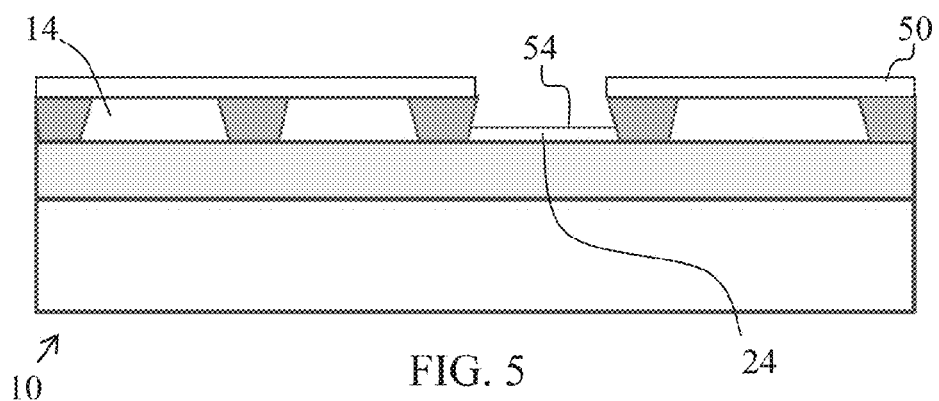

In an embodiment and as shown in FIG. 5, a mask 50 is formed and patterned over the structure of FIG. 4 to expose the remaining portion 42 of the sacrificial layer 22 (shown in FIG. 4). An exemplary mask 50 is photoresist. Then an etch process is performed to remove the remaining portion 42 of the sacrificial layer 22. As a result, an upper surface 54 of the thinned portion 24 of the semiconductor layer 14 is exposed. Thereafter, the mask 50 may be removed, such as by a strip process.

Figure 6:
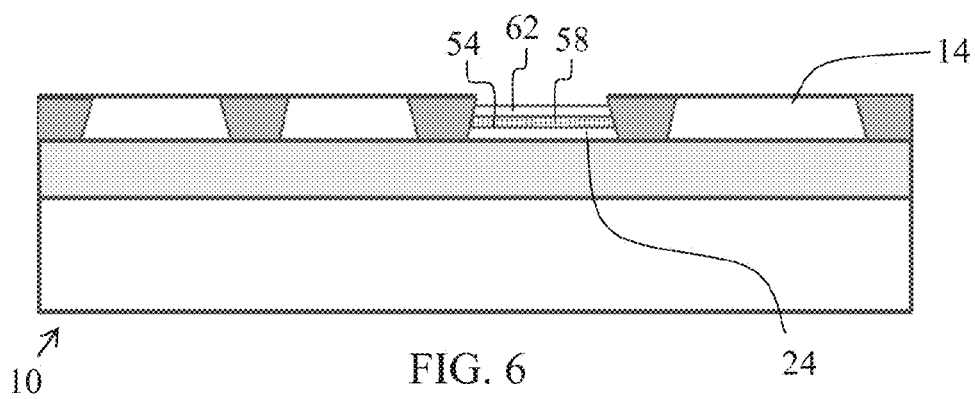

The process may continue in FIG. 6 with the selective formation of a relaxed layer 58 over the thinned portion 24 of the semiconductor layer 14. As used herein, the term "relaxed" refers to strain relaxation. In an exemplary embodiment, the relaxed layer 58 is formed by epitaxial growth followed by relaxation. For example, a silicon germanium (SiGe) layer 58 may be epitaxial grown on surface 54 of thinned region 24. In an exemplary embodiment, the relaxed SiGe layer 58 has a germanium content of from about 20 to about 40%. In an exemplary embodiment, the SiGe layer 58 is formed with a thickness of from about 50 to about 150 Angstroms. Though not shown, a dielectric layer, such as silicon oxide, may be formed over the non-thinned portions of the semiconductor layer 14 to prevent formation of the relaxed layer 58 thereon.

For SiGe layer 58, the SiGe material may be epitaxially grown by, for example, using a chemical vapor deposition (CVD) process, such as, for example, LPCVD. The silicon source may be, for example, silane ($SiH_4$) or DCS, and the germanium source may be, for example, germane ($GeH_4$) or digermane ($Ge_2H_6$). For epitaxial materials other than SiGe, molecular beam epitaxial growth (MBE) or metal organic CVD (MOCVD) may be used for epitaxial deposition.

As epitaxially grown on silicon, the SiGe layer will have a lattice constant that conforms to that of the silicon substrate. Upon relaxation (through a high temperature process for example) the SiGe lattice constant approaches that of its intrinsic lattice constant, which is larger than that of silicon, to thereby form a relaxed SiGe layer 58. A fully relaxed SiGe layer 58 has a lattice constant close to that of its intrinsic value. In an exemplary embodiment, MOCVD is used to form the SiGe layer 58.

As further shown in FIG. 6, a strained layer 62 is selectively formed over the relaxed layer 58. An exemplary strained layer 62 includes silicon. In an exemplary embodiment, silicon is epitaxially grown on the relaxed layer 58 by MOCVD. In an exemplary embodiment, the strained layer 62 is formed with a thickness of from about 100 to about 200 Angstroms. As a result, the combination of the thinned region 24 of semiconductor layer 14, relaxed layer 58 and strained layer 62 have a combined thickness of less than about 800 Angstroms, for example from about 350 to about 750 Angstroms, such as about 500 Angstroms.

When silicon is epitaxially grown on the relaxed SiGe layer 58, the silicon layer 62 experiences biaxial tensile strain. Specifically, when the silicon layer 62 is epitaxially grown on the relaxed SiGe layer 58, the silicon layer 62 conforms to the larger lattice constant of the relaxed SiGe layer 58. This applies physical biaxial stress (e.g., tensile expansion) to the resulting strained silicon layer 62. This physical stress applied to the silicon layer 62 is beneficial to the devices (e.g., CMOS devices) formed thereon because the expanded silicon layer increases electron mobility, resulting in improved N type device performance. The higher Ge concentration in the SiGe layer 58 increases hole mobility, resulting in improved P type device performance for devices formed thereon. Typically, a switch is formed as an N-type device, though a P-type device may be formed.

Figure 7:
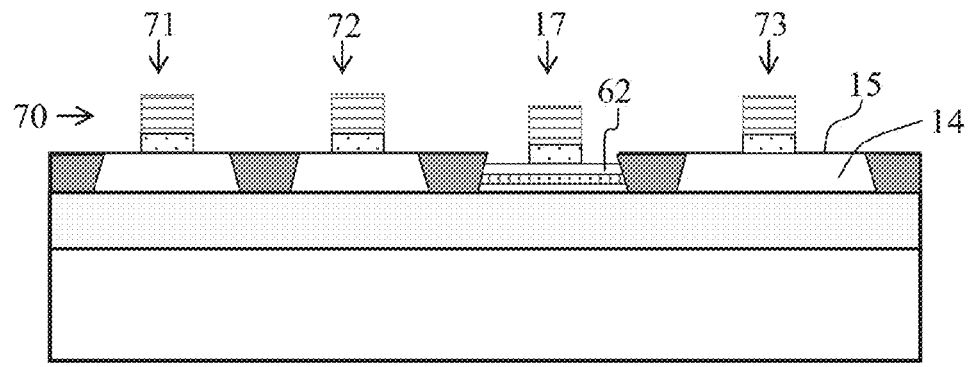

The method may continue in FIG. 7 with further processing. For example, conventional well implant mask formation and patterning, well implantations, gate insulator pre-clean, gate oxidation, gate material (e.g., polycrystalline silicon) deposition, gate masking, etching and resist strip processes may be performed to form gate structures 70 over appropriately doped well regions. As shown, gate structures 70 may be formed over the selected device region 17 and over other device regions 71, 72 and 73 during conventional CMOS processing. As shown, the gate structure 70 in device region 17 is formed on the strained layer 62, while the gate structures 70 in device regions 71, 72 and 73 are formed on the upper surface 15 of the semiconductor layer 14.

Figure 8:
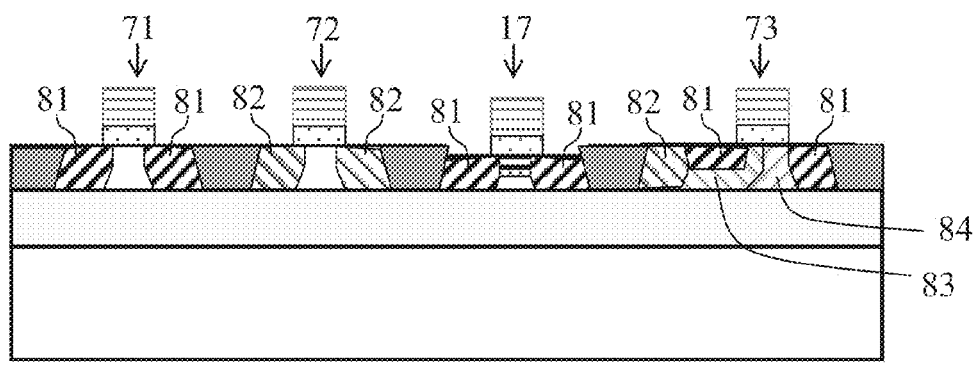

In FIG. 8, lightly doped drain (LDD) implantation and source/drain implantation processes are performed as in conventional CMOS processing. In the exemplary process of FIG. 8, heavily N doped regions 81 are formed in device regions 17, 71, and 73; heavily P doped regions 82 are formed in device regions 72 and 73; a lightly P doped region 83 is formed in device region 73; and a lightly N doped region 84 is formed in device region 73. The doping concentration and dopant types of active regions 81, 82, 83, and 84 are merely illustrative and any arrangement of doped regions may be provided for the formation of desired devices as is conventional in CMOS processing.

Figure 9:
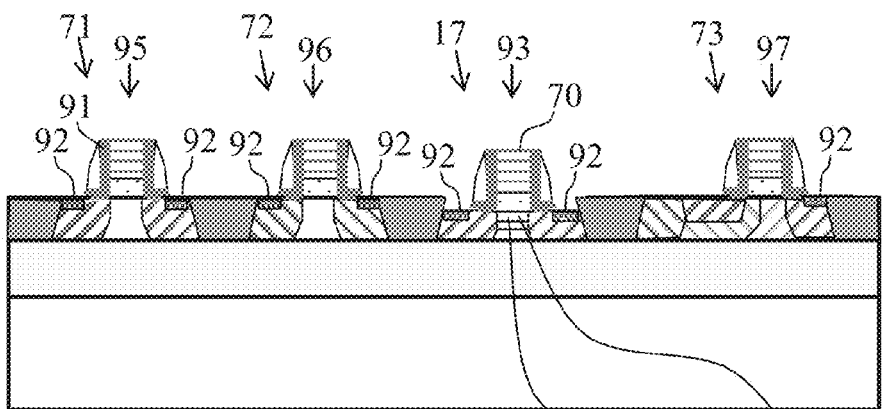

In FIG. 9, the exemplary process includes the conventional CMOS processing of forming spacers 91 around the gate structures 70. Further, a self-aligned silicidation process is performed to form silicide contacts 92 to selected device regions.

As shown in FIG. 9, a device 93, such as a switch FET device, is formed over the selected device region 17. The device 93 is formed in the device region 17 and includes a gate structure 70, active areas 81, and a channel 94 formed in the strained layer 62. Further, a NMOS device 95 for logic and analog is formed over device region 71. Also, a PMOS device 96 for logic and analog is formed over device region 72. Further, an EDMOS/LDMOS device 97, such as for a power amplifier, is formed over device region 73. Devices 95, 96 and 97 include channels that are not located in strained layers.

While device 93 is formed over a strained layer 62 overlying a relaxed layer 58, each of devices 95, 96 and 97 is not. Other devices that may be fabricated using conventional CMOS processing flow over the strained layer 62 include high-electron mobility transistor (HEMT) devices. A conventional MOSFET can also be formed over the strained silicon layer. The device is formed using exactly the same process flow as per CMOS processing, requiring only limited layout change and potentially additional implant masks for enhanced performance.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating an integrated circuit, the method comprising:
   providing a substrate including a semiconductor layer over an insulator layer, wherein the semiconductor layer has an upper surface;
   thinning a selected portion of the semiconductor layer to form a thinned region of the semiconductor layer, wherein thinning the selected portion of the semiconductor layer comprises converting an upper portion of the semiconductor layer into a sacrificial layer;
   selectively replacing portions of the semiconductor layer with insulator material to isolate the thinned region of the semiconductor layer, wherein selectively replacing the portions of the semiconductor layer with the insulator material comprises:
      selectively forming a hard mask over a second device region, wherein the portions of the semiconductor layer are not covered by the sacrificial layer or the hard mask;
      etching the portions of the semiconductor layer to form trenches exposing surface portions of the insulator layer;
      depositing the insulator material over the sacrificial layer, the hard mask, and the surface portions of the insulator layer; and
      performing a planarization process to remove the insulator material, the hard mask, and portions of the sacrificial layer located higher than the upper surface of the semiconductor layer;
   after selectively replacing the portions of the semiconductor layer with the insulator material, selectively etching the sacrificial layer;
   after selectively etching the sacrificial layer, selectively forming a relaxed layer on the thinned region of the semiconductor layer;
   selectively forming a strained layer on the relaxed layer; and
   forming a device over the strained layer.

2. The method of claim 1 wherein forming the device over the strained layer comprises:
   forming a switch field effect transistor device or a high-electron mobility transistor (HEMT) device over the strained layer.

3. The method of claim 1 wherein the insulator material forms a first isolation region and a second isolation region, and wherein the method further comprises:
   removing the sacrificial layer to uncover the thinned region of the semiconductor layer.

4. The method of claim 3 wherein the relaxed layer extends from the first isolation region to the second isolation region.

5. The method of claim 1 wherein thinning the selected portion of the semiconductor layer comprises:
   selectively oxidizing the upper portion of the semiconductor layer to provide the sacrificial layer and the thinned region of the semiconductor layer.

6. The method of claim 1 wherein a buried portion of the sacrificial layer is located lower than the upper surface of the semiconductor layer, and wherein the method further comprises:
   etching the buried portion of the sacrificial layer before selectively forming the relaxed layer on the thinned region of the isolated semiconductor layer.

7. The method of claim 1 wherein thinning the selected portion of the semiconductor layer comprises:
   selectively oxidizing the upper portion of the semiconductor layer to form an oxide mask overlying the thinned portion region of the semiconductor layer, and
   wherein selectively replacing the portions of the semiconductor layer with the insulator material further comprises:
   etching the semiconductor layer to form trenches adjacent the oxide mask and extending to the insulator layer; and
   depositing the insulator material in the trenches.

8. A method of fabricating an integrated circuit, the method comprising:
   providing a substrate including a semiconductor layer over an insulator layer;
   thinning a selected portion of the semiconductor layer to form a thinned region of the semiconductor layer, wherein thinning the selected portion of the semiconductor layer comprises converting an upper portion of the semiconductor layer into a sacrificial layer;
   selectively forming a hard mask over a second device region, wherein uncovered portions of the semiconductor layer are not covered by the sacrificial layer or the hard mask;
   etching the uncovered portions to form trenches exposing surface portions of the insulator layer;
   depositing insulator material over the sacrificial layer, the hard mask, and the surface portions of the insulator layer; and
   performing a planarization process to remove the insulator material, the hard mask, and portions of the sacrificial layer located higher than an upper surface of the semiconductor layer to form isolate the thinned region of the semiconductor layer with the insulator material.

9. The method of claim 8 further comprising:
   selectively forming a relaxed layer on the thinned region of the semiconductor layer;
   selectively forming a strained layer on the relaxed layer; and
   forming a device over the strained layer.

* * * * *